United States Patent [19]

Moates et al.

[11] 4,157,520

[45] Jun. 5, 1979

[54] MAGNETIC FLUX SHIFTING GROUND FAULT TRIP INDICATOR

[75] Inventors: Roger D. Moates, Tehran, Iran; Nicholas A. Tomasic, Plum Borough; Charles W. Leah, Washington Township, Fayette County, both of Pa.

[73] Assignee: Westinghouse Electric Corp., Pittsburgh, Pa.

[21] Appl. No.: 628,674

[22] Filed: Nov. 4, 1975

[51] Int. Cl.$^2$ .............................................. H01F 7/08
[52] U.S. Cl. ..................................... 335/230; 335/229
[58] Field of Search ................ 335/229, 230, 234, 179, 335/174, 79, 81

[56] References Cited

U.S. PATENT DOCUMENTS

| | | | |
|---|---|---|---|
| 3,783,423 | 1/1974 | Mater et al. | 335/229 |
| 3,893,052 | 7/1975 | Kotos et al. | 335/229 |
| 3,944,957 | 3/1976 | Kotos et al. | 335/229 |

*Primary Examiner*—Harold Broome
*Attorney, Agent, or Firm*—M. J. Moran

[57] ABSTRACT

A low energy mechanically driven and electromagnetically actuated ground fault trip indicator is taught. The ground fault trip indicator utilizes the magnetic flux of a permanent magnet in a first flux path to maintain a movable armature biased against a spring. An electromagnet is disposed to provide magnetic flux in opposition to the magnetic flux of the permanent magnet. The electromagnet is not energized for providing the opposing flux until a pulse is received from an appropriate ground fault trip detecting circuit. When the appropriate pulse of energy is applied to the electromagnet, a portion of the flux of the permanent magnet is cancelled allowing the spring to force the armature into a new position. In this position the flux of the permanent magnet is reestablished in a second flux path. When the indicator is in the latter position indication of the occurrence of a ground fault is given.

2 Claims, 2 Drawing Figures

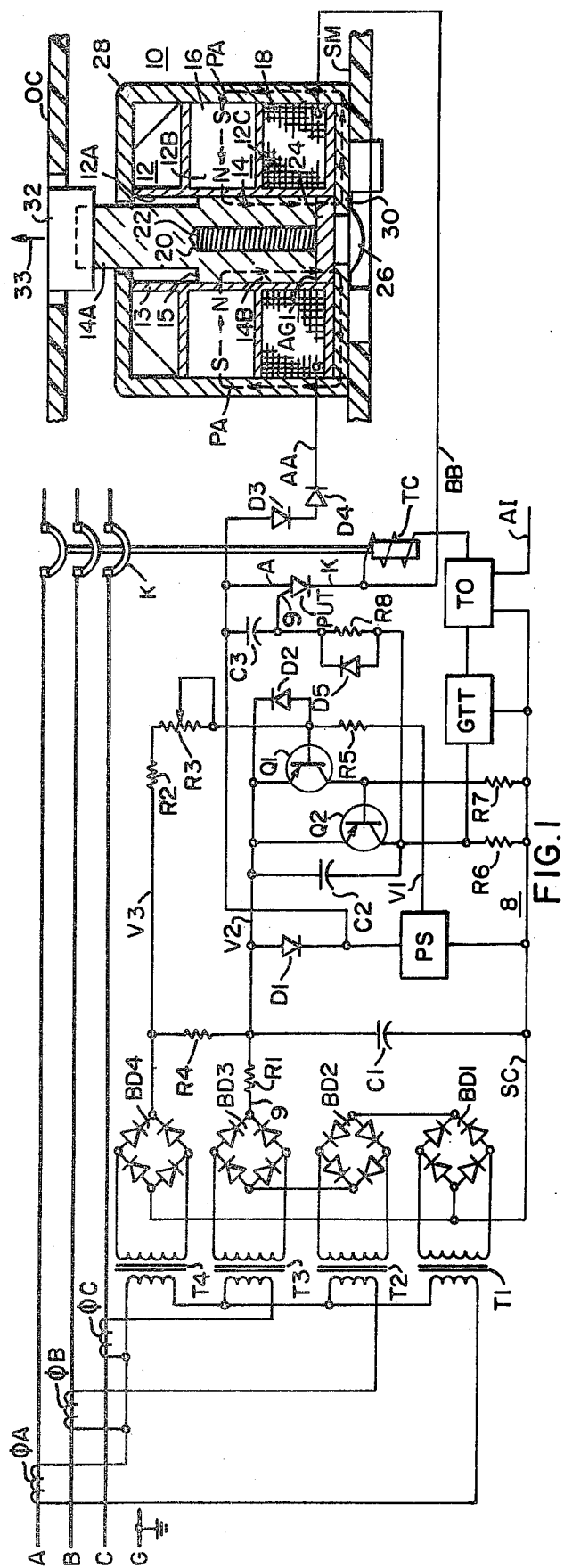

MAGNETIC FLUX SHIFTING GROUND FAULT TRIP INDICATOR

BACKGROUND OF THE INVENTION

The subject matter of this invention relates generally to ground fault indicators and specifically to low energy magnetic ground fault indicators.

Ground fault indicators of various types have been provided in the past for signalling an observer that a circuit breaker has tripped due to the influence of a ground fault. Devices which may be utilized with circuit breakers for this purpose are taught in a descriptive bulletin distributed under the registered trademark MINELCO. Various indicators are taught therein under the bulletin titles B-11A through B-13A, M-11A, M-12, M-13, M-14, M-16, M-17 and C-11. Furthermore, light reflecting status indicators are taught in a descriptive bulletin of Ferranti-Packard Ltd., Electronics Division, Toronto, Ontario, Canada. The descriptive bulletin is numbered 372 revised 0174. According to the latter-mentioned descriptive bulletin, patents covering the light reflecting status indicator are as follows: Canadian Pat. No. 641,350 and No. 771,356; U.S. Pat. No. 3,140,553 and United Kingdom Pat. No. 934,001. The latter descriptive bulletin also indicates that other patents are pending. The devices taught in both the latter and the former descriptive bulletins generally comprise a pivotally mounted permanent magnet which is disposed in the air gap of an electromagnet. The electromagnet may be energized temporarily to provide magnetic poles which are in opposition to the poles of the permanent magnet. This may cause the disposition of the permanent magnet to change from a first stable state to a second stable state, thus providing a mechanical indication of the occurrence of an event. It would be advantageous if an indicating device which utilizes electromagnetic principles and mechanical principles could be provided where the indicating means itself is not a permanent magnet, where a relatively low energy pulse could be provided to an electromagnetic means to cause a change in status indication and where the change in status indication is dramatic and obvious. Prior art devices teach members which are colored differently on either side thereof. Consequently, as the change in magnetic field causes movement of the magnetic member, one color is replaced by the other, thus providing the status indication previously described. Other U.S. patents which teach the utilization of electromagnetics or permanent magnets and/or mechanical moving devices are as follows: U.S. Pat. No. 3,221,246, issued Nov. 30, 1965 to C. B. Sanborn, Jr. This device teaches the utilization of two electromagnetic cores with a common reluctance changing device to provide an output electrical signal which is related to the disposition of the reluctance device. U.S. Pat. No. 2,540,845, issued Feb. 6, 1951 to C. A. Thomas teaches an electromagnetic keeper which is spring-biased to provide an alternate path for magnetic flux when an armature device is moved in a certain direction. U.S. Pat. No. 3,825,915, issued July 23, 1974 to R. C. Dow teaches a device for indicating the presence of an electric grounding means. The absence of the ground means is indicated electrically. U.S. Pat. No. 3,823,369, issued July 9, 1974 to R. R. P. Sinha teaches an electromechanical device which causes the illumination of a lamp for determining the condition of a transformer. U.S. Pat. No. 3,213,396, issued Oct. 19, 1965 to M. Berger teaches the indication of the disposition of a mechanical element by utilizing a three-leg transformer device having an air gap in the middle leg thereof. U.S. Pat. No. 3,128,441, issued Apr. 7, 1964 to E. W. Johnson et al. teaches a variable dynamo transformer having a linearly movable armature where the relative placement of the armature is responsible for the magnitude of an electrical signal at the output of the device. Finally, U.S. Pat. No. 3,101,462, issued Aug. 20, 1963 to E. L. Swainson teaches a linear motion signal producing magnetic transducer for producing a signal for indicating the linear position of an element. None of the above-mentioned descriptive bulletins or patents teach a flux shifting device for providing a low energy resettable mechanically forced but electromagnetically actuated indication of status. Furthermore, none of the above-mentioned inventions show status indication in relationship to the ground fault activity of a circuit breaker.

U.S. patents which are assigned to the assignee of the present invention which teach circuit breaker apparatus and sensing and control circuitry which may be utilized in conjunction with the present status indicating circuit are as follows: U.S. Pat. No. 3,543,094, issued Nov. 24, 1970 to W. H. South et al.; U.S. Pat. No. 3,602,783, issued Aug. 31, 1971 to J. C. Engle et al.; U.S. Pat. No. 3,634,730, issued Jan. 11, 1972 to J. T. Wilson; U.S. Pat. No. 3,660,722, issued May 2, 1972 to J. T. Wilson et al.; U.S. Pat. No. 3,666,994, issued June 18, 1970 to J. D. Watson et al. and U.S. Pat. No. 3,689,801, issued Sept. 5, 1972 to J. C. Engle et al.

U.S. Patents which are issued to the assignee which teach circuit breaker apparatus utilizing a flux shifting apparatus for tripping include for example, U.S. Pat. No. 3,783,423, issued Jan. 1, 1974 to A. E. Mater and J. A. Wafer.

SUMMARY OF THE INVENTION

In accordance with the invention a status indicating means and actuating and control system therefor is taught. The status indicating means is used as part of a circuit breaker apparatus. The status indicating means is provided to give an indication when a ground fault trip has occurred on the circuit breaker. The status indicating means comprises a longitudinally movable armature which is disposed in a cylindrical recess of a support member. The support member has a toroidally shaped electromagnet disposed at a bottom portion thereof and a toroidally shaped permanent magnet disposed at an upper portion thereof. The armature member is movable through the openings in the toroidal members. The permanent magnetic toroidal member has a north pole on its inner circumference and a south pole on its outer circumference. An enclosure is disposed around both of the latter-mentioned toroidal magnet members and a bottom plate is provided for the entire assembly. The movable armature is spring-loaded against a magnetic stub on the bottom plate. In a first or non-indicating position the magnetic flux provided by the permanent magnet travels through a portion of the armature downward towards the bottom plate and outward therefrom through the outer shell of magnetically conductive material to the south pole of the toroidal permanent magnet. This forms a first magnetic path which latches the indicating member against the bottom plate and heavily spring-loads it against the spring. The toroidal electromagnet is disposed to set up an opposite electromagnetic flux in the region where the armature abuts the bottom plate. When the electromagnet is energized the momentary presence of the oppositely disposed flux in the same flux path as that of the permanent magnet reduces the magnetic latching effect of the permanent magnet and allows the heavily loaded spring to force the armature away from the bottom plate to a position where the spring is relaxed. At this position the flux path of the permanent magnet is changed so as to go through the upper part of the armature through another part of the outer shell or casing and back to the south pole of the magnet. Consequently, in its second or unloaded position a second latching path is provided for the armature. Consequently, it can be seen that a relatively low energy electrical pulse can be utilized in the electromagnetic to cause the armature indicating member to be moved forcefully by the spring a relatively large distance for a clear indication of the happening of an event. In the preferred embodiment of the invention, the event which is indicated is the presence of a ground fault on a line to be protected and the tripping of the circuit breaker in response thereto.

BRIEF DESCRIPTION OF THE DRAWINGS

For a better understanding of the invention, reference may be had to the preferred embodiment exemplary of the invention shown in the accompanying drawings in which:

FIG. 1 shows a ground fault detecting electrical circuit and electrically interconnected status indicating means; and FIG. 2 shows the status indicating means of FIG. 1 in a second disposition.

DESCRIPTION OF THE PREFERRED EMBODIMENT

Referring now to the drawings and FIG. 1 in particular, a system 8 for sensing a ground fault current and reacting thereto is shown. There are provided three lines A, B and C which may carry three-phase alternating current or the like. There is also shown a schematic ground G. It is conceivable that part or all of the electrical current flowing through the lines A, B and C may be for one reason or another shunted to ground. In the event of such an occurrence, the system 8 will provide a trip signal to the trip coil TC to cause actuation of the contacts K to an open position. Also, the ground fault trip indicator 10 will be actuated to indicate clearly that a ground fault has caused the opening of the contacts K. It is to be understood that the contacts K may be opened for other reasons than a ground fault. As an example, overload currents may flow in any of the lines A, B and/or C which are not ground fault currents but which nevertheless necessitate an opening of the contacts K. There is provided an input sensing transformer which is connected in "Y" alternating current circuit configuration. These winding are identified as $\phi A$, $\phi B$ and $\phi C$. Each of the latter-named coils are connected respectively to the "Y" connected primary of input transformers T1, T2 and T3. The primary winding of a fourth transformer T4 is connected between the common point or midpoint of the "Y" connected windings $\phi A$, $\phi B$ and $\phi C$ and the common point or midpoint of the "Y" connected primary windings of transformers T1, T2 and T3. The secondary windings of the transformer T1 through T4 are connected respectively to the input terminals of bridges BD1 through BD4. The output terminals of the bridges BD1 through BD3 are connected together in series circuit relationship to form an output between a line or electrical conductor 9 and a system common SC. Connected in series circuit relationship between the line 9 and the system common SC is a resistive element R1 and a capacitive element C1. The resistive element is connected at one end to the line 9 and the capacitive element is connected at one end to the system common SC. Connected to one end of an output terminal of the bridge BD4 is one end of a resistive element R4, the other end of which is connected to the junction between the resistive element R1 and the capacitive element C1, and one end of the resistive element R2. The other end of the resistive element R2 is connected to one end of a rheostat or potentiometer R3. Also connected to the common terminal between the resistive element R1 and the capacitive element C1 is the anode of a diode element D1, one side of a capacitive element C2, the emitter of a transistor Q2, the emitter of a transistor Q1 and the cathode of a diode element D2. Connected to the cathode of the diode element D1 is one end of a power supply module PS, one end of a capacitive element C3, the anode terminal of a programmable unijunction transistor PUT and the anode of a diode element D3. The cathode of the diode element D3 is connected to the anode of another diode element D4. The cathode of the diode element D4 is connected to an electrical line AA. The cathode of the programmable unijunction transistor PUT is connected to one side of a trip coil TC and to an electrical line BB. The utilization of the lines AA and BB will be described hereinafter.

The other end of the previously mentioned potentiometer or rheostat element R3 is connected to the base of the previously described transistor Q1, the anode of the previously described diode D2 and one end of a resistive element R5. The other end of the resistive element R5 is connected to a voltage output line V1 of the previously described power supply PS. The collector of the transistor element Q2 and the other side of the capacitive element C2 are connected to one end of a resistive element R6, the other end of which is connected to the system common SC. The base of the transistor element Q2 and the collector of the transistor element Q1 are connected together and to one end of a resistive element R7. The other end of the resistive element R7 is connected to the system common SC. The junction between the capacitive element C2, the collector of the transistor Q2 and the previously described resistive element R6 is connected to the input terminal of a ground trip timing element GTT, one end of a resistive element R8 and the anode of a diode D5. The cathode of the diode element D5 and the other end of the resistive element R8 are electrically connected together and to the other end of the previously described capacitive element C3 as well as the gate of the previously described programmable unijunction transistor PUT. The output of the ground trip timing circuit module GTT is connected to one input of a trip output circuit TO, the output of which is connected to the other side of the trip coil TC. The trip output circuit TO has a second input A1 connected to other electrical circuitry, such as shown in the previously described patents assigned to the assignee of the present invention and sold under the registered trademark AMPTECTOR. The common terminals of the power supply PS, the ground trip timing circuit GTT and the trip output circuit TO are connected to the previously described system common SC.

There is also provided a ground trip indicating means or indicator 10. The magnetic ground trip indicator system 10 is connected to a suitable support base SM, such as the kind which may be found in certain portions of metal-clad switchgear or the like. There is also provided an outside cover OC which may constitute an external cover for a metal-clad switchgear or the outer insulating case of a low voltage circuit breaker. The ground fault trip indicator 10 comprises a support frame 12 which may comprise a central cylindrical opening 12A and first and second toroidal-shaped or doughnut-shaped chambers 12B and 12C which surround the cylindrical chamber 12A but which are separated therefrom by a cylindrical wall 13. An armature or movable indicating means 14 may be disposed in the previously described cylindrical chamber 12A so as to move longitudinally thereof. The movable armature or plunger 14 may be generally cylindrical in shape. The plunger 14 may comprise an upper cylindrical region 14A and a lower cylindrical region 14B where the upper cylindrical region 14A has a relatively smaller transverse radius than the lower cylindrical portion 14B. The latter two portions may be separated by a shoulder 15. There may be provided in the first chamber 12B a toroidally shaped permanent magnet 16. The permanent magnet 16 may have a north magnetic pole orientation on the inner circumferential region thereof and a south magnetic pole orientation on the outer circumferential region thereof. There may be provided in the second chamber 12C a toroidally shaped electromagnetic member or means 18. The input or energizing lines for the toroidally shaped electromagnetic member 18 may be connected to the electrical lines AA and BB.

The previously described armature or plunger 14 may have a cylindrical bore 20 disposed longitudinally along the centerline thereof. There may be disposed in the cylindrical bore 20 a spring or other compressible driving means 22, one end of which is disposed against an inner portion of the plunger 14 and the other end of which is disposed against the stub of magnetic material 24. Stub 24 may comprise a cylindrical shape which is generally of the same radius as the lower part 14B of the plunger 14 and the inner diameter of the cylindrical opening 12A. The stub 24 and the bottom of the support member 12 are disposed against and supported by the magnetic support member 30. There is disposed around the entire support base 12 a circular electromagnetic shell 28 having an upper lip portion which extends radially inwardly to the circumference of the upper portion 14A of the plunger 14. The shell 28, the base 30, the stub 24 and the plunger 14 comprised magnetic material such that magnetic flux lines may be easily conducted thereby in paths of relatively low reluctance. The region between the bottom of the plunger 14 and the top of the stub 24 comprises a very narrow but discernible air gap AG1 even when the plunger 14 and stub 24 abut. As shown in FIG. 1 the plunger 14 is disposed in a reset or non-fault indicating disposition such that flux lines flow along a path PA from the north pole of the permanent magnet 16 inwardly through the outer circumferential volume of the region 14B of the plunger 14 and downwardly through the air gap AG1 into the stub 24. From the stub 24 which is anchored to the base 30 by way of a rivet 26 or similar anchoring means, the flux path PA moves radially outwardly through the magnetic support base 30 into the previously described outer shell 28. The flux path PA then moves upwardly through the cylindrical magnetic shell 28 to the south pole of the permanent magnet 16. Consequently, in the set or non-ground fault indicating position, the spring 20 is compressed between the armature 14 and the stub 24. The armature 24 is latched in the position shown in FIG. 1 due to the magnetic force generated by the flux lines in the path PA and will remain in that position until the flux density in the air gap AG1 is reduced to a sufficient value to be overcome by the force of the charged spring 20 to cause the plunger 14 to move upwardly with respect to the orientation of the drawing of FIG. 1. There is disposed on the top of the armature 14 a pushbutton or similar indicating means 32 which provides the dual purposes of giving an indication that the plunger 14 has moved relative to the outside cover OC and of resetting the pushbutton.

OPERATION OF THE GROUND FAULT INDICATOR DURING NON-GROUND FAULT CONDITIONS

Generally, if the currents flowing in the lines A, B and C are not of a predetermined overload magnitude sufficient to require opening of the contacts K, the serially connected diode bridges BD1 through BD3 provide an output voltage V2 at the junction of the resistive element R1 and the capacitive element C1, the latter element acting as a filter and storage capacitor for the output of the serially connected bridges. In the preferred embodiment of the invention V2 is 35 volts. The power supply PS provides an output voltage V1 at the output thereof which in the preferred embodiment is approximately 19.6 volts. This causes the transistor element Q1 to be forward-biased through the resistive element R5, thus causing the collector-to-emitter circuit of the transistor element Q1 to be generally a short-circuit. The virtual short-circuit across the collector to emitter circuit of the transistor element Q1 prevents forward biasing of the base-to-emitter circuit of the transistor element Q2, thus essentially providing an open circuit across the collector-to-emitter circuit of transistor Q2. Since the capacitive element C2 is connected across the collector-to-emitter circuit of the transistor element Q2, it is essentially free to charge through the resistive element R6 to the voltage value V2. Ignoring the effects of ripple, it can be seen that the voltage provided to the anode of the diode D5 and to one end of the resistive element R8 is significantly less than 35 volts. It can also be seen that the voltage on the end of the capacitive element C3, which is connected to the cathode of the diode element D5 is essentially 35 volts. Such being the case, the diode element D5 is reversed-biased. The large voltage across the capacitive element C3 provides a negative voltage from the gate g to the anode a of the programmable unijunction transistor PUT. This condition places the programmable unijunction transistor PUT in a conducting state from the anode a to the cathode k thereof. This essentially provides a low resistance shunt path for the ground fault indicator 10 connected between the lines AA and BB of FIG. 1. Since the diode bridge BD4 provides an output voltage V3 only when ground fault current is flowing in one of the lines A, B or C, or any combination thereof, essentially no current flows through the resistive elements R2, R3 and R4. Should an overload occur on any one or all of the lines A, B or C, the alternate input AI for the trip output module TO would be energized to provide a closed path for the trip coil TC from the junction between the capacitive element C1 and the resistive element R1 through the diode D1, through the anode-to-cathode path of the programmable unijunction transistor PUT, through the trip coil TC and through the trip output module TO to the return or system common line SC. This would cause actuation of the separable main contacts K, thus interrupting the current flow in lines A, B and C. However, even though a tripping action has taken place, the ground fault status indicator 10 will remain in the disposition shown in FIG. 1 because of the presence of the low resistance shunt path through the programmable unijunction transistor PUT. This low resistance path shunts current which would otherwise energize the electromagnet 18 of the ground trip indicator 10.

OPERATION OF THE GROUND TRIP INDICATOR UNDER GROUND FAULT CONDITIONS

It will be noted that if a ground fault current exists between any of the lines A, B and/or C and the ground G, the transformer T4 will be excited thus providing an input voltage to the bridge BD4, thus providing an output voltage V3. The output voltage V3 is essentially equal to the voltage drop V2 across the capacitive element C1 plus the voltage drop due to the current flowing out of the output terminal of the bridge BD4 through the resistive element R4. Resistive elements R2, R3 and R5 are connected in series circuit relationship between the output of the bridge BD4 at voltage V3 and the output of the power supply PS at voltage V1. The voltage divider relationship between the resistive elements R2, R3 and R5 is such that a predetermined amount of ground fault current will cause the voltage at the base of the transistor element Q1 to exceed the voltage V2, thus causing the transistor element Q1 to be reverse-biased. If the transistor element Q1 is reverse-biased, the collector-to-emitter circuit thereof is essentially open, thus causing the base-to-emitter circuit of the transistor element Q2 to be forward-biased. This causes the collector-to-emitter circuit of the transistor element Q2 to be turned on which essentially short-circuits the capacitive element C2. Once again ignoring the ripple effect across the capacitive element C1, the latter operation has the effect of providing a voltage which is approximately equal to the voltage value V2 to the junction between the anode of the diode element D5 and the resistive element R8. This has the effect of forward-biasing the diode element D5, thus quickly discharging the capacitive element C3. When the capacitive element C3 discharges, the voltage drop thereacross decreases towards zero volts. Eventually a point is reached where the gate-to-anode voltage of the programmable unijunction transistor PUT is such that the programmable unijunction transistor PUT turns off, thus removing the previously described low impedance shunt path between the lines AA and BB.

The virtual short-circuiting of the capacitive element C2 introduces a relatively large voltage across the resistive element R6, which provides a tripping signal to the ground trip timing circuit GTT. After an appropriate interval, an output signal is provided at the output of the ground trip timing circuit GTT which energizes the trip output circuit TO, thus providing a path for energizing current to flow through the trip coil TC. The latter path includes the diode D1, the diodes D3 and D4, the line AA, the electromagnet 18, the line BB, the trip coil TC, a portion of the trip output circuit TO and the return or system common line SC. This not only energizes the trip coil TC as before, thus opening the separable main contacts K, but also energizes the electromagnet 18.

Electromagnet 18 is disposed and wound such that its north-south pole orientation is opposite to that of the permanent magnet 16. Such being the case, the flux in the air gap AG1 is opposed by the flux from the electromagnet 18 which flows along the same flux path PA but in an opposite direction. This provides a total reduced magnetic effect in the air gap AG1. The spring 22, which is in a loaded position, has sufficient force to overcome the resultant lower magnetic force and the plunger or armature 14 moves in a direction 33 to given an indication of a ground fault trip operation.

The energy for actuating the trip coil TC and for energizing the electromagnet 18 is only available until the separable main contacts K open, after which the voltage outputs on the bridges BD1 through BD4 fall significantly. Consequently, it can be seen that the energy supplied by the lines AA and BB to the electromagnet 18 is in the form of a relatively short duration pulse. However, because of the flux shifting arrangement of the trip indicator 10, the spring 22 forces the armature 14 to a position which corresponds to the relaxing of compression in the spring 22.

Referring now to FIG. 2, the disposition of the ground fault status indicator 10 is shown for the indicating position. It will be noted that the spring 22, which is now in the non-compressed or generally relaxed disposition, has moved the armature 14 and its attached indicating cap 32 outwardly away from the outside cover OC to provide a clear indication that an event has occurred. Of course, in the preferred embodiment of the invention, the event spoken of is the tripping of a circuit breaker due to the presence of a ground fault. Since the armature 14 is made of magnetically conductive material, it will be noted that a new flux path now exists from the north pole of the permanent magnet 16 through the lower portion 14B of the armature 14 and through the upper portion of the case or shell 28 to the south pole S of the permanent magnet 16. It will also be noted that at this time the electromagnet 18 is no longer energized. The presence of the flux path PB latches or holds the armature 14 in its new indicating position. Thus an indication of a trip due to a ground fault is provided.

The trip status indicator 10 can be thought of as having a memory function. It is to be noted that even after the main contacts K of the circuit breaker apparatus have been opened, and even after they may have been closed again on a ground fault or on a non-ground faulted circuit, the indication will remain. In order to reset the status indicator 10 for subsequent indication of ground fault, an operator simply pushes the armature 14 in the direction 34 against the spring 22 until the air gap AG2, which is large in the indicating state is reduced to the size of the air gap AG1 shown in FIG. 1. This shifts the flux once again from the path PB to the path PA as shown in FIG. 1, which is now the path of least reluctance. The ground fault indicator is now ready for a new ground fault indication, should that be necessary. It will be noted that once the ground fault status indicator has been reset, as previously described, it will remain in that status even if the trip coil of the circuit breaker causes the separable main contacts K to open once again due to a non-ground fault overload condition. Consequently, it can be seen that the status indicator 10 only provides an indication of circuit breaker trip when there has been a ground fault trip operation.

It is to be understood with respect to the various embodiments of the invention that the voltage values V1 through V3 are not limiting. It is also to be understood that in some embodiments of the invention, the status indicator 10 and the energizing circuitry 8 may be utilized for DC operation provided the transformers previously spoken of are appropriately replaced for DC operation. It is also to be understood that the diode element D2 is provided to protect the base-to-emitter circuit of the transistor element Q1 from a voltage transient in the reverse direction. It is also to be understood that the resistive element R7 comprises a collector resistor for the transistor element Q1. It is also to be understood that the apparatus shown herein may be utilized on single-phase alternating current circuitry.

The apparatus disclosed in the embodiments of the invention have many advantages. One advantage lies in the fact that the status indicator and ground fault sensing and actuating circuit cooperates structurally and functionally to provide a resettable low energy indication of the occurrence of a ground fault trip on a circuit apparatus. Another advantage lies in the fact that the status indicator 10 is latchable magnetically in both the non-indicating and the indicating positions. Another advantage lies in the fact that the status indicator has a memory function, as was described previously. Another advantage lies in the fact that the scope and degree of indication is generally large as those characteristics are enhanced by the relatively long longitudinal travel of the armature 14 between the indicating and non-indicating positions. Another advantage lies in the fact that the indicating armature also acts as a resetting element for the status indicator and also acts as part of the latching system for the status indicator.

We claim:

1. A circuit interrupter, comprising:
   (a) separable main contacts for interconnecting portions of an electrical line;
   (b) a magnetic material support means having a generally cylindrical opening therein;
   (c) a generally cylindrical indicating member of magnetic material, said indicating member being disposed in said opening, said indicating member being moved generally longitudinal of said opening from a first longitudinal position to a second longitudinal position on the opening of said contacts;
   (d) spring means disposed in cooperating arrangement with said support means and said indicating member for causing said movement of said indicating member from said first position to said second position;
   (e) a generally cylindrical permanent magnet having a central opening therein and being disposed on said support means, said indicating member being movable through said central opening, said permanent magnet being disposed to provide a first closed magnetic flux path through said support means and through said indicating member when said indicating member is in said first position for thus latching said indicating member in said first position, said permanent magnet means also providing a second closed magnetic flux path in said support means and said indicating member when said indicating member is in said second position for thus latching said indicating member in said second position;
   (f) a generally cylindrical electromagnet having a central opening therein and being disposed on said support means, said indicating member being movable through said central opening, said electromagnet being disposed to provide opposing magnetic flux in said first closed flux path when said electromagnet is energized, said opposing flux reducing the total magnetic flux in said first path, thus reducing said magnetic latching of said indicating member in said first position, thus allowing said spring member to move said indicating member from said first position to said second position, said indicating member being manually movable to said first position from said second position for reset; and
   (g) electrical energizing means electrically connected to said electromagnet for providing a pulse of energy to said electromagnet member to thus provide said opposing magnetic flux when said separable main contacts open to thus provide an indication of the provision of said pulse of energy even after said pulse has ended.

2. The combination as claimed in claim 1 wherein said energizing means is interconnected with said electrical line to sense the electrical status thereof, said energizing means providing said pulse of energy only when a ground fault exists on a portion of said electrical line.

* * * * *